(12) United States Patent
Yurke

(10) Patent No.: US 12,207,481 B2
(45) Date of Patent: Jan. 21, 2025

(54) BALLISTIC EXCITON TRANSISTOR

(71) Applicant: Boise State University, Boise, ID (US)

(72) Inventor: Bernard Yurke, Boise, ID (US)

(73) Assignee: Boise State University, Boise, ID (US)

( * ) Notice: Subject to any disclaimer, the term of this patent is extended or adjusted under 35 U.S.C. 154(b) by 565 days.

(21) Appl. No.: 17/643,080

(22) Filed: Dec. 7, 2021

(65) Prior Publication Data
US 2022/0181566 A1 Jun. 9, 2022

Related U.S. Application Data

(60) Provisional application No. 63/199,104, filed on Dec. 7, 2020.

(51) Int. Cl.
*H01L 23/58* (2006.01)
*H10K 30/65* (2023.01)

(52) U.S. Cl.
CPC ................................ *H10K 30/65* (2023.02)

(58) Field of Classification Search
CPC ...... H10K 30/65; H10K 10/50; H10K 10/484; Y02E 10/549
See application file for complete search history.

(56) References Cited

U.S. PATENT DOCUMENTS

| | | | |
|---|---|---|---|
| 2017/0190573 A1* | 7/2017 | Shen | B82Y 40/00 |
| 2018/0044372 A1* | 2/2018 | Han | C07H 1/00 |
| 2019/0048036 A1* | 2/2019 | Yurke | C09B 11/08 |

OTHER PUBLICATIONS

Abramavicius et al., "Extracting single and two-exciton couplings in photosynthetic complexes by coherent two-dimensional electronic spectra", Chemical Physics, vol. 357, pp. 79-84, 2009.
Andreakou et al., "Optically controlled excitonic transistor", Applied Physics Letters, vol. 104, 091101, pp. 1-7, 2014.
Bui et al., "Programmable Periodicity of Quantum Dot Arrays with DNA Origami Nanotubes", Nano Letters, vol. 10, pp. 3367-3372, 2010.
Bush et al., "Synthesis of DNA Origami Scaffolds: Current and Emerging Strategies", Molecules, vol. 25, No. 3386, pp. 1-18, 2020.
Carvalho et al., "A review on pedestal waveguides for low loss optical guiding, optical amplifiers and nonlinear optics applications", Journal of Luminescence, vol. 203, pp. 135-144, 2018.
Ding et al., "Interconnecting Gold Islands with DNA Origami Nanotubes", Nano Letters, vol. 10, pp. 5065-5069, 2010.

(Continued)

*Primary Examiner* — Samuel Park

(57) ABSTRACT

An excitonic device comprises an exciton transmission line comprised of a row of molecules. Propagation of excitons is mediated by an exciton exchange interaction. The gate consists of a molecule "a" that interacts with a proximal molecule via a two-body exciton interaction. If the gate molecule is not excited, it does not couple to the transmission line thereby allowing incoming signals to propagate unimpeded. If the gate molecule is excited, signals are back scattered as a result of the two-body interaction between the exciton residing on "a" and the excitons on the transmission line. The ballistic exciton transistor has industrial applications that extend to at least fast optical switching, optical communication, exciton devices, and exciton-based information processing.

16 Claims, 3 Drawing Sheets

(56) References Cited

OTHER PUBLICATIONS

Douglas et al., "DNA-nanotube-induced alignment of membrane proteins for NMR structure determination", PNAS, vol. 104, No. 16, pp. 6644-6648, 2007.

Gopinath et al., "Engineering and mapping nanocavity emission via precision placement of DNA origami", Nature, vol. 535, pp. 401-418, 2016.

Jacquemin, Denis, "Excited-State Dipole and Quadrupole Moments: TD-DFT versus CC2", Journal of Chemical Theory and Computation, vol. 12, pp. 3993-4003, 2016.

Lusk et al., "Control of Exciton Transport using Quantum Interference", Physical Review B, vol. 92, No. 24, DOI:10.1103/PhysRevB.92.241112, pp. 1-6, 2015.

Righini et al., "Glass optical waveguides: a review of fabrication techniques", Optical Engineering, vol. 53, No. 7, 071819, pp. 1-16, 2014.

Rothemund, Paul W. K., "Folding DNA to create nanoscale shapes and patterns", Nature, vol. 440, pp. 297-302, 2006.

Sawaya et al., "Excitonics: A Set of Gates for Molecular Exciton Processing and Signaling", ACS Nano, vol. 12, pp. 6410-6420, 2018.

Teshome et al., "Topography-controlled alignment of DNA origami nanotubes on nanopatterned surfaces", Nanoscale, vol. 6, pp. 1790-1796, 2014.

Woo et al., "Self-assembly of two-dimensional DNA origami lattices using cation-controlled surface diffusion", Nature Communications, vol. 5, No. 4889, pp. 1-10, 2014.

Xiaohua et al., "Optical Switching Technology Comparison: Optical MEMS Vs. Other Technologies", IEEE Optical Communications, pp. S16-S23, 2003.

Yurke et al., "Passive linear nanoscale optical and molecular electronics device synthesis from nanoparticles", Physical Review A, vol. 81, pp. 033814-1-033814-9, 2010.

\* cited by examiner

BALLISTIC EXCITON TRANSISTOR

CROSS REFERENCE TO RELATED APPLICATIONS

This application claims priority under 35 U.S.C. § 119 to provisional patent application U.S. Ser. No. 63/199,104, filed Dec. 7, 2020. The provisional patent application is herein incorporated by reference in its entirety, including without limitation, the specification, claims, and abstract, as well as any figures, tables, appendices, or drawings thereof.

STATEMENT REGARDING FEDERALLY SPONSORED RESEARCH OR DEVELOPMENT

This invention was made with government support under Grant Number US DE-SC0020089 awarded by the United States Department of Energy. The government has certain rights in the invention.

FIELD OF THE INVENTION

The present invention relates generally to a ballistic exciton transistor and/or corresponding method(s) of use and manufacture. The excitonic device has industrial applications that extend to at least fast optical switching, optical communication, exciton devices, and exciton-based information processing.

BACKGROUND OF THE INVENTION

The background description provided herein gives context for the present disclosure. Work of the presently named inventors, as well as aspects of the description that may not otherwise qualify as prior art at the time of filing, are neither expressly nor impliedly admitted as prior art.

The rate of miniaturization of solid-state transistors is slowing. A logical end to same is thus in sight. Moore's law, i.e., the number of transistors in a dense integrated circuit (IC) doubling about every two years, will cease to be true unless new approaches to increase transistor density continue to be discovered.

An exciton is the name for the energy packet that resides on a chromophore when it is in its excited state. When two molecules are very close to each other the energy of an excited chromophore can be transferred to a neighboring chromophore without energy loss, in contrast to the usual fluorescence resonance energy transfer (FRET) where energy loss occurs in the transfer. The packet of energy can be exchanged in a wave like manner back and forth between the two molecules. The energy packet, in this sense, acts like a quantum mechanical particle that can become delocalized or spread out over an aggregate of chromophores just like an electron can spread out its wave function over an entire molecule (molecular orbital). The Davydov splitting and the circular dichroism (CD) spectra seen in chromophore aggregates is a manifestation of this delocalization. Davydov splitting is analogous to the splitting of orbitals into bonding and antibonding orbitals when two atoms are brought close together.

When two or more chromophores are spaced sufficiently close (nanospaced), near-field interactions, such as, but not limited to, electromagnetic dipole-dipole interactions form. This can result in an increase in the coupling strength between two or more chromophores and a change in absorption of light relating to its polarization. The coupling strength between the two or more chromophore dipoles increases such that they are either weakly or strongly coupled opposed to being very weakly coupled or uncoupled. When the proximity of the chromophores is such that their orbitals overlap, in some cases this may result in an additional increase in coupling strength.

Optical systems are also becoming increasingly popular due to their high speed and high data capacity capabilities. Light has bidirectional transmission reciprocity in common dielectric materials. Breaking this reciprocity in the direction of light transmission is of great significance in classical and quantum information processing. Optical isolators, circulators, switches, and directional amplifiers are examples of non-reciprocal devices. Optical isolators are optical components which allow the transmission of light in only one direction and are typically used to prevent unwanted feedback into an optical oscillator. Optical circulators are three- or four-port optical devices designed such that light entering any of the ports exits from the next. Optical switches are devices which selectively direct optical signals from one channel to another. Optical directional amplifiers are devices which amplify an optical signal without first converting it into an electronic signal.

There exists a need in the art for a device which uses molecular dyes as networked aggregates to overcome the limitations of classical physics in achieving additional transistor densities beyond what may be achievable ultimately with traditional solid-state devices.

SUMMARY OF THE INVENTION

The following objects, features, advantages, aspects, and/or embodiments, are not exhaustive and do not limit the overall disclosure. No single embodiment need provide each and every object, feature, or advantage. Any of the objects, features, advantages, aspects, and/or embodiments disclosed herein can be integrated with one another, either in full or in part.

According to some aspects of the present disclosure, the device comprises an exciton transmission line composed of a row of chromophores (dyes). The excitons considered here are molecular excitations in which the chromophore is excited from the ground state to the lowest electronic excited state. Propagation of excitons (or their delocalization) along the line (i.e., between dyes) is mediated by an exciton exchange interaction having strength denoted by the excitonic hopping parameter J. This strength—and consequently the ability to maintain transmission along the line—is dependent on the dye orientation and proximity relative to the other dyes in the line. The gate comprises a dye whose transition dipole moment is oriented orthogonally to the transition-line dipoles along the transmission line. In that configuration an exciton is not able to transfer from the gate dye to the exciton transmission line. An exciton on the gate dye can interact with excitons on the transmission line only via a two-body exciton interaction (i.e., two dyes—the gate and its proximal dye on the transmission line—are each separately excited) having strength denoted by the parameter K (exciton-exciton interaction energy). This interaction results from changes in the charge distribution that occur when a dye molecule is excited to its lowest electronic excited state. If the gate dye is not excited, K=0 and transmission along the line occurs unimpeded. If the gate molecule is excited and K is sufficiently large, signals are backscattered as a result of the two-body interaction. As a result, the device can function as an on/off gate relative to signal propagation along the transmission line. The gate dye can be excited optically without exciting the transmission-line dyes if polarized light with a polarization parallel to the gate molecule transition dipole moment is used, because this polarization direction is orthogonal to the transition dipole moments of the transmission-line dyes. Alternatively, the gate dye can be excited optically without exciting the transmission-line dyes if the optical excitation energies of the gate dye and the transmission-line dyes are chosen so that the absorption band of the gate dye does not overlap with that of the transmission-line dyes. In this case light, regardless of polarization, will excite only the gate dye if the light wavelength lies within the absorption band of the gate dye.

According to some other aspects of the present disclosure, the ballistic exciton transistor relies on the exciton exchange interaction and the two-body exciton interaction. In the dipole approximation the exciton exchange interaction is mediated by transition dipoles ($\mu$), whereas the two-body exciton interaction is mediated by the difference static dipoles ($\Delta d$). The direction of the transition dipole and the difference dipole need not be parallel, as they depend on the molecular structure in different ways. This allows for the possibility of orienting two chromophores (dyes a and $b_0$) such that they can interact only via the two-body exciton interaction.

It is a primary object, feature, and/or advantage of the present invention to improve on or overcome the deficiencies in the art.

It is a further object, feature, and/or advantage of the present invention to provide a ballistic exciton transistor.

It is yet a further object, feature, and/or advantage of the present invention to position, orient, and configure molecules so as to selectively and optimally exchange/transfer excitons within certain regions of the ballistic exciton transistor.

It is yet a further object, feature, and/or advantage of the present invention to propagate signals through an exciton transmission line so as to produce signal gain.

The ballistic exciton transistor disclosed herein can be used in a wide variety of applications. For example, the ballistic exciton transistor can be beneficially used for optical switching and optical communication.

Methods can be practiced which facilitate use, manufacture, assembly, maintenance, and repair of the ballistic exciton transistor which accomplish some or all of the previously stated objectives.

The ballistic exciton transistor can be incorporated into exciton-based information processing devices and systems, including, but not limited to quantum information processing systems, quantum computers, optical switches, and/or other devices and systems which accomplish some or all of the previously stated objectives.

The immediately following numbered paragraphs characterize an exemplary optical switch that can be constructed employing at least some of the beneficial aspects described herein.

A. An optical switch comprising:
a source waveguide that can carry a signal for switching;
a drain waveguide that can carry a fraction of the signal that has been transmitted through the device;
a gate waveguide that can modify or enable carrying said signal from the source waveguide to the drain waveguide while performing the switching;
an exciton channel;
a coupler coupling the exciton channel to each of the source waveguide, the gate waveguide, and the drain waveguide, said coupler capable of converting photons into excitons and vice versa;
a row of molecules arranged along a length of the exciton channel, wherein said row of molecules use said excitons to transport energy of said photons that arrive at the source waveguide and, as modified or enabled by the gate waveguide, to the drain waveguide; and
a gate molecule having a transition dipole moment oriented orthogonally to transition dipoles along the exciton channel.

B. The optical switch of paragraph A, wherein the signal comprises light.

C. The optical switch of paragraph B, wherein the light can be modulated so as to be turned on and off.

D. The optical switch of paragraph A, wherein the exciton channel comprises a DNA origami nanotube.

E. The optical switch of paragraph D, wherein the molecules are dyes.

F. The optical switch of paragraph E, wherein the coupler comprises gold pads attached to each of the source waveguide, the gate waveguide, and the drain waveguide.

G. The optical switch of paragraph F, wherein an electric field can concentrate on said gold pads and induce electric field oscillations in the dyes.

H. The optical switch of paragraph D, wherein the DNA origami nanotube includes five duplex strands of DNA symmetrically arrayed about the exciton channel.

I. The optical switch of paragraph H, wherein the duplex strands of DNA comprise a M13 bacteriophage.

J. The optical switch of paragraph H, wherein the DNA origami nanotube comprises a three-dimensional geometrical shape formed from one long scaffold strand.

K. The optical switch of paragraph J, wherein the geometrical shape is assembled by folding said long scaffold strand in an aqueous solution consisting of a buffer containing salt.

L. The optical switch of paragraph K, wherein the solution is heated to a temperature between 60° C. and 90° C.

M. The optical switch of paragraph E, wherein the DNA origami nanotube comprises a size that is approximately identical to a diameter of said dyes.

N. The optical switch of paragraph E, wherein the dyes are attached to DNA, said dyes optionally comprising Cyanine dyes Cy5 and/or Cy5.5.

O. The optical switch of paragraph E, wherein the dyes have an asymmetric conjugated $\pi$-bond network, said dyes optionally comprising a dye selected from any one or more of the Dyomics dyes DY-550 through DY-831.

P. The optical switch of paragraph A, wherein the transition dipole comprises a strength of approximately 16 D.

Q. The optical switch of paragraph A, wherein the gate dye and the proximal dye along the exciton channel cause a difference static dipole moments of a strength of approximately 16 D.

R. The optical switch of paragraph A, wherein the coupler is capable of:
(i) converting the photons into plasmons; and
(ii) converting the plasmons into the excitons.

S. The optical switch of paragraph R, wherein the optical switch is configured as a reciprocal device and a conversion according to steps (i) and (ii) is just as efficient as reciprocal conversions that include: (iii) converting the excitons to the plasmons; and (iv) the plasmons to the photons.

T. The optical switch of paragraph A, wherein the fraction is not a zero percent fraction nor a one-hundred percent fraction.

These and/or other objects, features, advantages, aspects, and/or embodiments will become apparent to those skilled in the art after reviewing the following brief and detailed descriptions of the drawings. Furthermore, the present disclosure encompasses aspects and/or embodiments not expressly disclosed but which can be understood from a reading of the present disclosure, including at least: (a) combinations of disclosed aspects and/or embodiments and/or (b) reasonable modifications not shown or described.

BRIEF DESCRIPTION OF THE DRAWINGS

Several embodiments in which the present invention can be practiced are illustrated and described in detail, wherein like reference characters represent like components throughout the several views. The drawings are presented for exemplary purposes and may not be to scale unless otherwise indicated.

An artisan of ordinary skill in the art need not view, within isolated figure(s), the near infinite number of distinct permutations of features described in the following detailed description to facilitate an understanding of the present invention.

DETAILED DESCRIPTION OF THE INVENTION

The present disclosure is not to be limited to that described herein. Mechanical, electrical, chemical, procedural, and/or other changes can be made without departing from the spirit and scope of the present invention. No features shown or described are essential to permit basic operation of the present invention unless otherwise indicated.

Figure 1:
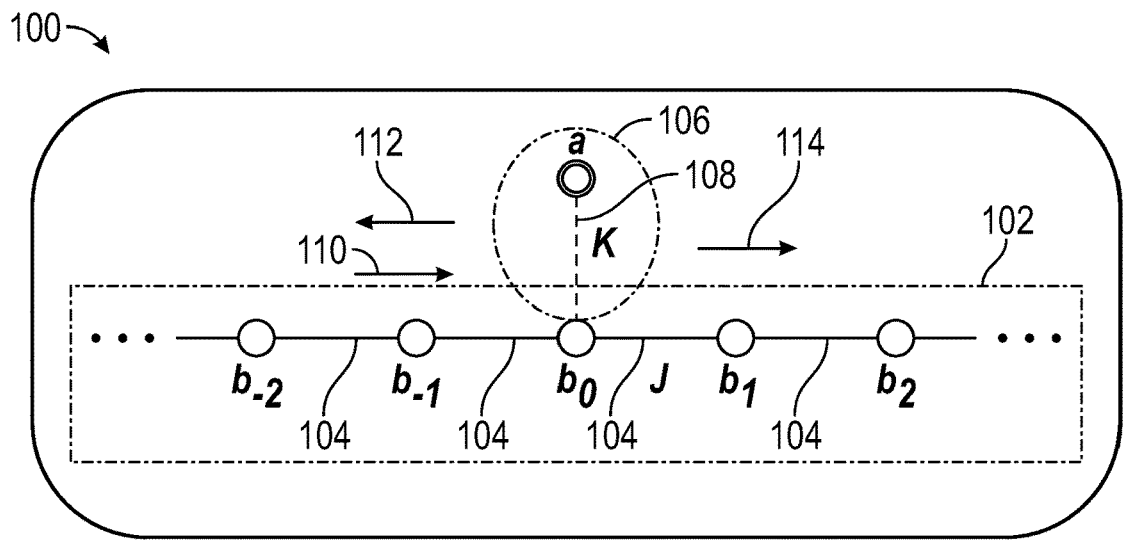
FIG. 1 shows an exemplary ballistic exciton transistor, according to some aspects of the present disclosure.

Referring now to FIG. 1, the ballistic exciton transistor 100 comprises an exciton transmission line 102 comprised of a row of molecules $b_r$. The row of molecules $b_r$ are labeled such because r represents the position of different molecules along the exciton transmission line 102, with 0 being an origin defined by the position of the molecule $b_0$ proximal to the gate mechanism a. Propagation (delocalization) of excitons along the transmission line 102 is mediated by exciton exchange interaction(s) 104.

The exciton exchange interaction 104 is represented in FIG. 1 by at least one solid line between a plurality of the molecules $b_r$. The exciton exchange interaction 104 has a strength characterized by the parameter J. As shown, the gate 106 comprises a gate molecule a (double circle) that interacts with molecule $b_0$ via a two-body exciton interaction 108 of a strength characterized by the parameter K. If gate molecule a is not excited, the gate molecule a does not couple to the transmission line 102. This allows incoming signals 110 to propagate unimpeded. If gate molecule a is excited, some of the incoming signals 110 become reflected signals 112 and are back scattered as a result of the two-body interaction between the exciton residing on gate molecule a and the excitons on the transmission line 102.

In one embodiment, the ballistic exciton transistor 100 can be described as including an excitonic interchange. Like road traffic interchanges, the excitonic interchange can act as a sophisticated junction or junction-like system where exchange interactions can occur. In other words, the excitonic exchange can be thought of as the means by which excitons can be exchanged and otherwise transmitted amongst molecules. For example, the excitonic exchange can comprise a first location at which a linear exciton exchange interaction can occur, said linear exciton exchange interaction being mediated by a transition dipole along the exciton transmission line; and a second location at which a two-body exciton interaction can occur, said two-body exciton being mediated by a difference static dipole along the transmission line.

The ballistic exciton transistor 100 relies on the exciton exchange interaction 104 and the two-body exciton interaction 108. In the dipole approximation the exciton exchange interaction is mediated by transition dipoles (μ), whereas the two-body exciton interaction is mediated by the difference static dipoles (Δd). The direction of the transition dipole and the difference dipole need not be parallel, as they depend on the molecular structure in different ways. This allows for the possibility of orienting two chromophores (dyes a and $b_0$) such that they can interact only via the two-body exciton interaction.

Squaraine dyes are an example of this in which a pair of two squaraines can be arranged such that their transition dipoles are orthogonal and, hence, do not couple (i.e., propagate an exciton), whereas the exciton-exciton interaction is mediated by a Coulombic quadrupole-quadruple interaction. The asymmetric dyes offered by Dyomics whose product numbers are in the range DY-610 through DY-780 offer examples of this. Molecule a of FIG. 1 can be selectively chosen and/or arranged to have such an orientation in relation to the molecules of the transmission line 102. Consequently, if molecule a is excited, for example, by the absorption of a photon, the exciton is trapped on the molecule and is able to backscatter excitons propagating on the transmission line. This provides a signal gain in the sense that a single exciton can control the flow of a large number of excitons on the transmission line 102.

The Hamiltonian

The molecule labels a and $b_r$ of FIG. 1 can also be used to denote the exciton annihilation operator for excitons residing on the molecule. When a single exciton resides on the transmission line 102, a single exciton may or may not reside on the gate molecule a. As a consequence, the only two-exciton interaction (e.g., 108) that needs be considered is that between molecule a and the transmission line 102. The nearest-neighbor approximation can be made. The transmission line 102 will be taken to have infinite extent on both sides of $b_0$.

The Hamiltonian operator for the system of FIG. 1 can be described as:

$$H = \hbar\omega_o a^\dagger a + \hbar\omega_K a^\dagger b_0^\dagger b_0 a + \sum_{r=-\infty}^{\infty} \hbar\omega_o b_r^\dagger b_r + \sum_{r=-\infty}^{\infty} \hbar\omega_J\left(b_{r+1}^\dagger b_r + b_r^\dagger b_{r+1}\right)$$

where $\hbar$ is a time-dependent constant, ω is a frequency, and † is used to identify specific number operators.

Heisenberg Equations of Motion

The Heisenberg equation of motion for an operator O is $$\frac{dO}{dt} = \frac{i}{\hbar}[H, O] + \frac{\partial O}{\partial t}.$$

The following are equations of motion for the gate molecule a, the proximal molecule $b_0$, and any molecule $b_r$ along the transmission line 102:

$$\frac{da}{dt} = -i\omega_o a - i\omega_K b_0^\dagger b_0 a,$$

$$\frac{db_0}{dt} = -i\omega_o b_0 - i\omega_K a^\dagger a b_0 - i\omega_J (b_1 + b_{-1}),$$

and where $r \neq 0$, $$\frac{db_r}{dt} = -i\omega_o b_r - i\omega_J (b_{r+1} + b_{r-1}).$$

Solving for the above Heisenberg equation of motion with the equations of motion for the gate molecule a, the proximal molecule $b_0$, and any molecule $b_r$ along the transmission line 102 yields:

$$\frac{d}{dt}(a^\dagger a) = 0.$$

The number operator $a^\dagger a$ for the number of excitons on molecule a can be treated as a constant.

Exciton Transmission Lines

If there is no exciton on molecule a, then the number operator $a^\dagger a$ can be replaced by its eigenvalue which is zero. In this case, the equation for motion with respect to $b_r$ holds even at $r \neq 0$:

$$\frac{db_r}{dt} = -i\omega_o b_r - i\omega_J (b_{r+1} + b_{r-1})$$

for all r. Due to the translation symmetry the solutions of the above equation of motion will have the Bloch form:

$$b_r = \frac{1}{\sqrt{2\pi}} \int_{-\pi}^{\pi} dk \, e^{-i(\omega_k t - kr)} b(k)$$

where k is the wave number, yielding the dispersion relation:

$\omega_k = \omega_o + 2\omega_j \cos(k).$

The group velocity is defined:

$$v_g = \frac{\partial \omega_k}{\partial k} = -2\omega_J \sin(k).$$

Note $\omega_j$ can be positive or negative. It is positive if the molecules are aligned side by side (H configuration) or end to end (J configuration). The phase velocity $v_\phi = \omega_k/k$ can have a different speed and sign from that of the group velocity, $v_g$. Note also that the group velocity, $v_g$, has the greatest magnitude when $k = \pm \pi/2$, for which the Bloch form can be written in the form:

$$b_r = \frac{1}{\sqrt{2\pi}} \int_0^\pi dk \, e^{-i(\omega_k t - kr)} b(k) + \frac{1}{\sqrt{2\pi}} \int_0^\pi dk \, e^{-i(\omega_k t + kr)} b(-k)$$

where the signals carried by b(k) and b(-k) propagate in opposite directions. The transmission line signals 110, 114 propagate unimpeded along the transmission line 102.

Exciton Scattering Off of an Exciton

Where $\omega_J$ is negative, the signals carried by b(k) propagate to the left in the exciton transmission line 102 shown in FIG. 1 and those carried by b(-k) propagate to the right. When the numerical operator $a^\dagger a$ is not zero, one must solve for the two distinct equations of motion provided above (i.e., solve for when $r \neq 0$ and when $r = 0$).

For $r \neq 0$, the result is still:

$$b_r = \frac{1}{\sqrt{2\pi}} \int_0^\pi dk \, e^{-i(\omega_k t - kr)} b(k) + \frac{1}{\sqrt{2\pi}} \int_0^\pi dk \, e^{-i(\omega_k t + kr)} b(-k)$$

because causality signals propagating in from infinity will not be influenced by what happens at $r = 0$ until the signals arrive at that point. For signals coming toward $r = 0$ and which are leaving $r = 0$, for the transmission line to the left of $r = 0$, the result is:

$$b_r = \frac{1}{\sqrt{2\pi}} \int_0^\pi dk \, e^{-i(\omega_k t - kr)} b_L^{out}(k) + \frac{1}{\sqrt{2\pi}} \int_0^\pi dk \, e^{-i(\omega_k t + kr)} b_L^{in}(k)$$

for $r < 0$ and for the transmission line 102 to the right of $r = 0$ results in:

$$b_r = \frac{1}{\sqrt{2\pi}} \int_0^\pi dk \, e^{-i(\omega_k t - kr)} b_R^{in}(k) + \frac{1}{\sqrt{2\pi}} \int_0^\pi dk \, e^{-i(\omega_k t + kr)} b_R^{out}(k)$$

for $r > 0$.

If the number of excitons at the gate molecule a is zero, variables in the previous two equations can be solved for as follows:

$b_L^{out}(k) = b_R^{in}(k) = b(k)$ and $b_R^{out}(k) = b_L^{in}(k) = b(-k)$

If the gate molecule a is excited, then:

$$b_0 = \frac{1}{\sqrt{2\pi}} \int_0^\pi dk \, e^{-i\omega_k t} b(k)$$

yielding the following by way of the $b_r$ equations for $r < 0$ and $r > 0$ above:

$(\omega_k - \omega_o - \omega_K a^\dagger a) b(k) = \omega_J [e^{ik} b_R^{in}(k) + e^{-ik} b_R^{out}(k) + e^{-ik} b_L^{out}(k) + e^{ik} b_L^{in}(k)],$ $\omega_J b(k) = (\omega_k - \omega_o - \omega_J e^{ik}) e^{ik} b_R^{in}(k) + (\omega_k - \omega w_o - \omega_J e^{-ik}) e^{-ik} b_R^{out}(k),$ $$\omega_J b(k) = (\omega_k - \omega_o - \omega_J e^{-ik}) e^{-ik} b_L^{out}(k) + (\omega_k - \omega_o - w_J e^{ik}) e^{ik} b_L^{in}(k).$$

Note:

$$\omega_k - \omega_o = \omega_J(e^{ik} + e^{-ik})$$

and thus collectively this yields:

$$[\omega_J(e^{ik} + e^{-ik}) - \omega_K a^\dagger a] b(k) = [e^{ik} b_R^{in}(k) + e^{-ik} b_R^{out}(k) + e^{-ik} b_L^{out}(k) + e^{ik} b_L^{in}(k)]$$

$$b(k) = b_R^{in}(k) + b_R^{out}(k),$$

$$b(k) = b_L^{in}(k) + b_L^{out}(k).$$

$$[\omega_J(e^{ik} + e^{-ik}) - \omega_K a^\dagger a][b_R^{in}(k) + b_R^{out}(k)] = \omega_J[e^{ik} b_R^{in}(k) + e^{-ik} b_R^{out}(k) + e^{-ik} b_L^{out}(k) + e^{ik} b_L^{in}(k)],$$

$$[\omega_J(e^{ik} + e^{-ik}) - \omega_K a^\dagger a][b_L^{in}(k) + b_L^{out}(k)] = \omega_J[e^{ik} b_R^{in}(k) + e^{-ik} b_R^{out}(k) + e^{-ik} b_L^{out}(k) + e^{ik} b_L^{in}(k)].$$

The last two equations rearranged yield:

$$\omega_J e^{-ik} b_L^{out}(k) - (\omega_J e^{ik} - \omega_K a^\dagger a) b_R^{out}(k) = -\omega_J e^{ik} b_L^{in}(k) + (\omega_J e^{-ik} - \omega_K a^\dagger a) b_R^{in}(k),$$

$$-(\omega_J e^{ik} - \omega_K a^\dagger a) b_L^{out}(k) + \omega_J e^{-ik} b_R^{out}(k) = (\omega_J e^{-ik} - \omega_K a^\dagger a) b_L^{in}(k) - \omega_J e^{ik} b_R^{in}(k).$$

This can be reduced by introducing the quantities:

$$F_1 = -\omega_J e^{ik} b_L^{in}(k) + (\omega_J e^{-ik} - \omega_K a^\dagger a) b_R^{in}(k),$$

$$F_2 = (\omega_J e^{-ik} - \omega_K a^\dagger a) b_L^{in}(k) - \omega_J e^{ik} b_R^{in}(k).$$

Further rewritten, these equations can be expressed as:

$$\omega_J e^{-ik} b_L^{out}(k) - (\omega_J e^{ik} - \omega_K a^\dagger a) b_R^{out}(k) = F_1$$

$$-(\omega_J e^{ik} - \omega_K a^\dagger a) b_L^{out}(k) + \omega_J e^{-ik} b_R^{out}(k) = F_2$$

and in Matrix form:

$$\begin{bmatrix} \omega_J e^{-ik} & -(\omega_J e^{ik} - \omega_K a^\dagger a) \\ -(\omega_J e^{ik} - \omega_K a^\dagger a) & \omega_J e^{-ik} \end{bmatrix} \begin{bmatrix} b_L^{out}(k) \\ b_R^{out}(k) \end{bmatrix} = \begin{bmatrix} F_1 \\ F_2 \end{bmatrix}.$$

Solving for $b_L^{out}(k)$ and $b_R^{out}(k)$, this finds:

$$b_L^{out}(k) = \frac{\omega_J e^{-ik} F_1 + (\omega_J e^{ik} - \omega_K a^\dagger a) F_2}{\omega_J^2 e^{-i2k} - (\omega_J e^{ik} - \omega_K a^\dagger a)^2}$$

and $$b_R^{out}(k) = \frac{(\omega_J e^{ik} - \omega_K a^\dagger a) F_1 + \omega_J e^{-ik} F_2}{\omega_J^2 e^{-i2k} - (\omega_J e^{ik} - \omega_K a^\dagger a)^2}.$$

In other words:

$$\omega_J e^{-ik} F_1 + (\omega_J e^{ik} - \omega_K a^\dagger a) F_2 =$$
$$(|\omega_J e^{ik} - \omega_K a^\dagger a|^2 - \omega_J^2) b_L^{in}(k) - 2i\omega_J[\omega_J \sin(2k) - \omega_K \sin(k) a^\dagger a] b_R^{in}(k),$$

$$(\omega_J e^{ik} - \omega_K a^\dagger a) F_1 + \omega_J e^{-ik} F_2 =$$
$$-2i\omega_J[\omega_J \sin(2k) - \omega_K \sin(k) a^\dagger a] b_L^{in}(k) + (|\omega_J e^{ik} - \omega_K a^\dagger a|^2 - \omega_J^2) b_R^{in}(k).$$

One now has:

$$|\omega_J e^{ik} - \omega_K a^\dagger a|^2 - \omega_J^2 = -2\omega_J \omega_K \cos(k) a^\dagger a + \omega_K^2 a^\dagger a a^\dagger a.$$

And again, solving for $b_L^{out}(k)$ and $b_R^{out}(k)$:

$$b_L^{out}(k) = \frac{|\omega_J e^{ik} - \omega_K a^\dagger a|^2 - \omega_J^2}{\omega_J^2 e^{-i2k} - (\omega_J e^{ik} - \omega_K a^\dagger a)^2} b_L^{in}(k) -$$
$$\frac{2i\omega_J[\omega_J \sin(2k) - \omega_K \sin(k) a^\dagger a]}{\omega_J^2 e^{-i2k} - (\omega_J e^{ik} - \omega_K a^\dagger a)^2} b_R^{in}(k)$$

$$b_R^{out}(k) = -\frac{2i\omega_J[\omega_J \sin(2k) - \omega_K \sin(k) a^\dagger a]}{\omega_J^2 e^{-i2k} - (\omega_J e^{ik} - \omega_K a^\dagger a)^2} b_L^{in}(k) +$$
$$\frac{|\omega_J e^{ik} - \omega_K a^\dagger a|^2 - \omega_J^2}{\omega_J^2 e^{-i2k} - (\omega_J e^{ik} - \omega_K a^\dagger a)^2} b_R^{in}(k).$$

The transmission T and the reflection R amplitudes can be introduced as:

$$T = -\frac{2i\omega_J[\omega_J \sin(2k) - \omega_K \sin(k) a^\dagger a]}{\omega_J^2 e^{-i2k} - (\omega_J e^{ik} - \omega_K a^\dagger a)^2}$$

and $$R = \frac{|\omega_J e^{ik} - \omega_K a^\dagger a|^2 - \omega_J^2}{\omega_J^2 e^{-i2k} - (\omega_J e^{ik} - \omega_K a^\dagger a)^2}.$$

When there are no excitons in molecule a, the number operator $a^\dagger a$ can be replaced by zero and one obtains T=1 and R=0. Now:

$$\omega_J^2 e^{-i2k} - (\omega_J e^{ik} - \omega_K a^\dagger a)^2 = -2i\omega_J[\omega_J \sin(2k) - \omega_K \sin(k) a^\dagger a] + 2\omega_J \omega_K \cos(k) a^\dagger a - \omega_K^2 a^\dagger a a^\dagger a.$$

The transmission amplitude can be rewritten as:

$$T = \frac{2i\omega_J[\omega_J \sin(2k) - \omega_K \sin(k) a^\dagger a]}{2i\omega_J[\omega_J \sin(2k) - \omega_K \sin(k) a^\dagger a] + 2\omega_J \omega_K \cos(k) a^\dagger a - \omega_K^2 a^\dagger a a^\dagger a}.$$

The transmission coefficient (transmission probability) can be expressed:

$$|T|^2 = \frac{4\omega_J^2[\omega_J \sin(2k) - \omega_K \sin(k) a^\dagger a]^2}{4\omega_J^2[\omega_J \sin(2k) - \omega_K \sin(k) a^\dagger a] + [2\omega_J \omega_K \cos(k) - \omega_K^2 a^\dagger a]^2 (a^\dagger a)^2}.$$

So if one exciton is present in molecule a, $a^\dagger a$ can be replaced by 1 and the transmission coefficient can then be expressed as:

$$|T|^2 = \frac{4\omega_J^2[\omega_J \sin(2k) - \omega_K \sin(k)]^2}{4\omega_J^2[\omega_J \sin(2k) - \omega_K \sin(k)] + [2\omega_J \omega_K \cos(k) - \omega_K^2]^2}.$$

The behavior of this system when the excitons are at the bottom of the band can be particularly beneficial because in the case when $\omega_j$ is negative and k is near zero, a Taylor expansion of trigonometric functions in the equation above will yield:

$$\cos\theta = 1 - \frac{\theta^2}{2!} + \frac{\theta^4}{4!} + \ldots$$

$$\sin\theta = \theta - \frac{\theta^3}{3!} + \frac{\theta^5}{5!} + \ldots$$

For strong switching, the numerator would ideally be as small as possible. For example, if one were to minimize $|\omega_J \sin(2k) - \omega_K \sin(k)|$, the Taylor expansions would become:

$$\omega_J \sin(2k) - \omega_K \sin(k) = (2\omega_J - \omega_K)k - \frac{8\omega_J - \omega_K}{3!}k^3 + \ldots$$

$$2\omega_J \cos(k) - \omega_K = 2\omega_J - \omega_K - 2\omega_J\left(\frac{k^2}{2!} - \frac{k^4}{4!} + \ldots\right).$$

To make the first equation above as small as possible as k approaches 0, the linear order term can be eliminated by setting the condition:

$$\omega_K = 2\omega_J$$

and with this condition the lowest order becomes:

$$|T|^2 = k^2.$$

Midband Performance

For a signal propagating at mid band, that is $k=\pi/2$, the condition set above should not be imposed. In this case one has:

$$|T|^2 = \frac{4\omega_J^2}{4\omega_J^2 + \omega_K^2}.$$

To make the transition coefficient as small as possible, one would like to make $\omega_K$ (that is K) as large as possible. If we choose such a value to satisfy $\omega_K = 2\omega_J$ then $|T|^2 = \frac{1}{2}$. Hence, it may be possible to achieve a switching amplitude at room temperature of a factor of at least 2. The equation $\omega_K = 2\omega_J$ suggests much higher switching ratios could be achieved at low temperatures.

Bound States

If the two-exciton interaction 108, $K = \hbar\omega_K$, is sufficiently strong and negative, exciton-exciton bound states can form between the exciton in the gate molecule a and an exciton on the transmission line 102. It is possible to determine the conditions when a bound state can form. It is noted that the existence of such bound states enables other mode of operation of the exciton transistor 100. The bound state will suppress the row of excitons 102 through the transistor 100 if there is a repulsive two-body interaction 108 between excitons on the transmission line 102. The Hamiltonian for such an interaction would have the form:

$$H_{ex-ex} = \sum_{r=-\infty}^{\infty} K_T b_{r+1}^\dagger b_r^\dagger b_r b_{r+1}$$

where $K_T$ is the interaction energy between two excitons residing on neighboring sites. Alternatively, if the anharmonicity parameter $\Delta$ is positive, it will be unfavorable for two excitons to occupy the same molecule and this will suppress the row of excitons 102 through the exciton transistor 100. The Hamiltonian for this interaction is given by:

$$H_{an} = \sum_{r=-\infty}^{\infty} \frac{\Delta}{2} b_r^\dagger b_r^\dagger b_r b_r.$$

In the limit $\Delta \to \infty$ the excitons behave as hard-core Bosons. In this case, flow through the transistor 100 would be completely suppressed. In this limit, the Hamiltonian can be dispensed with if the molecules $b_r$ are treated as satisfying Paulion commutation relations. The bound state mode is expected to have the form:

$$b_r = b_B e^{-i\omega_K t} e^{-\kappa|r|}$$

where molecules $b_r$ need no longer satisfy the usual boson commutation relations. The equations of motion will still need to be satisfied such that:

$$\omega_K - \omega_o - \omega_K a^\dagger a = 2\omega_J e^{-\kappa}$$

and $$\omega_K = \omega_o + 2\omega_J \cosh(\kappa).$$

The two equations together yield:

$$\sinh(\kappa) = \frac{\omega_K}{2\omega_J} a^\dagger a$$

and from this one can obtain:

$$\cosh(\kappa) = \sqrt{1 + \left(\frac{\omega_K}{2\omega_J} a^\dagger a\right)^2}.$$

Hence:

$$\omega_K = \omega_o + 2\omega_J \sqrt{1 + \left(\frac{\omega_K}{2\omega_J} a^\dagger a\right)^2}.$$

$\omega_J$ is negative at the bottom of the transmission line band when k=0. It follows that the energy at the bottom of the band in frequency units is:

$$\omega_0 = \omega_o + 2\omega_J.$$

The condition for the existence of a bound state is $$\omega_K < \omega_o$$

and with this condition the equations of [0064] and [0065] yield:

$$\omega_J \sqrt{1 + \left(\frac{\omega_K}{2\omega_J} a^\dagger a\right)^2} < \omega_J.$$

and since $\omega_J$ is negative this further yields:

$$\sqrt{1 + \left(\frac{\omega_K}{2\omega_J} a^\dagger a\right)^2} > 1.$$

which is satisfied when the numerical operator $a^\dagger a$ has an eigenvalue greater than 0. It can be concluded that when $\omega_J$ is negative and the exciton-exciton interaction is attractive ($\omega_K$ is negative) there can be a bound state.

The analysis with $\omega_J<0$ and $\omega_K<0$ can be plagued by the existence of a bound state unless a proper analysis of transmission through the exciton transistor 100 is done and one takes into account the bound state.

Suppression of Transmission by a Repulsive Interaction

Figure 2:
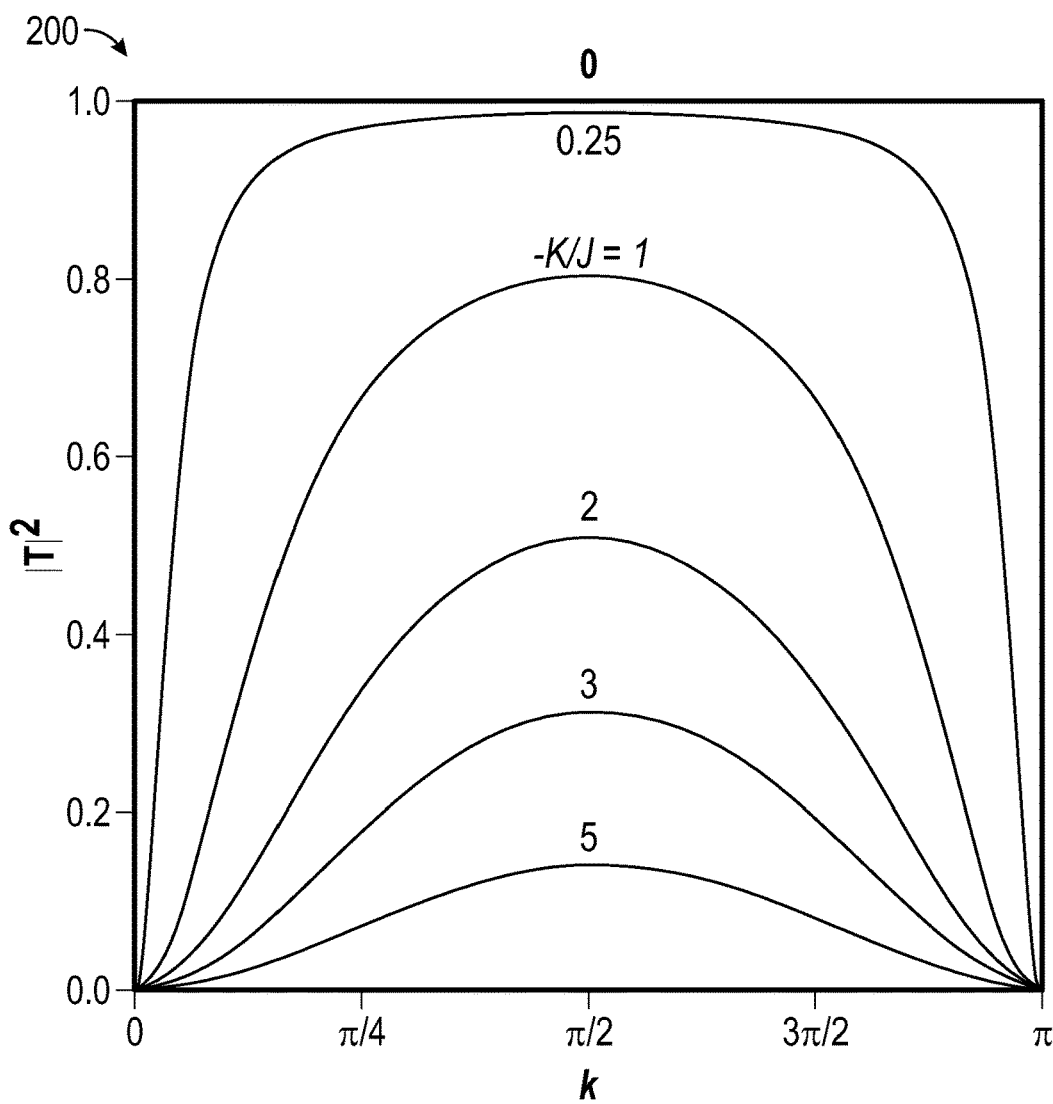
FIG. 2 shows transmission probability, $|T|^2$, through the exciton transistor when one exciton resides on the gate molecule plotted as a function of k for various values of $-\omega_K/\omega_J=-K/J$.

When $\omega_J=0$ so that the bottom of the band occurs at k=0 and the exciton-exciton interaction is positive $\omega_K>0$, suppression of transmission still occurs due to the repulsive interaction. For example, as shown in FIG. 2, the transmission probability (coefficient) $|T|^2$ is plotted as a function of k for various values of $-\omega_K/\omega_J=-K/J$. The transmission coefficient peaks at midband $k=\pi/2$ where the transmission coefficient reduces to:

$$|T|^2 = \frac{4\omega_J^2}{4\omega_J^2 + \omega_K^2}.$$

Switching on-off contrast improves the larger the ratio $|\omega_K|/|\omega_J|$ becomes. When $|\omega_K|=2|\omega_J|$ this yields $|T|^2=\frac{1}{2}$. The switching contrast is larger for smaller values of k, that is, when the incoming signals 110 are near the band minimum. When $\omega_K >> 2|\omega_J|$, the transmission coefficient becomes:

$$|T|^2 = \frac{4\omega_J^2 \sin^2(k)}{\omega_K^2} = 4\left(\frac{\omega_J}{\omega_K}\right)^2 \sin^2(k).$$

When k<<1, the transmission coefficient becomes:

$$|T|^2 = 4\left(\frac{\omega_J}{\omega_K}\right)^2 k^2.$$

For ballistic transport of excitons along a chain of chromophores (e.g., molecules $b_n$), $|\omega_J|$ should be as large as possible to minimize decoherence due to exciton-vibron coupling. The exciton transistor described here should then become feasible provided such molecules can be found for which $|\omega_K|$ is correspondingly large even when the molecular pair is configured such that the transition dipoles are orthogonal.

Constructing an Exciton Transistor

According to one embodiment, the exciton transistor 100 can be fabricated as shown in FIGS. 3-6.

Figure 3:
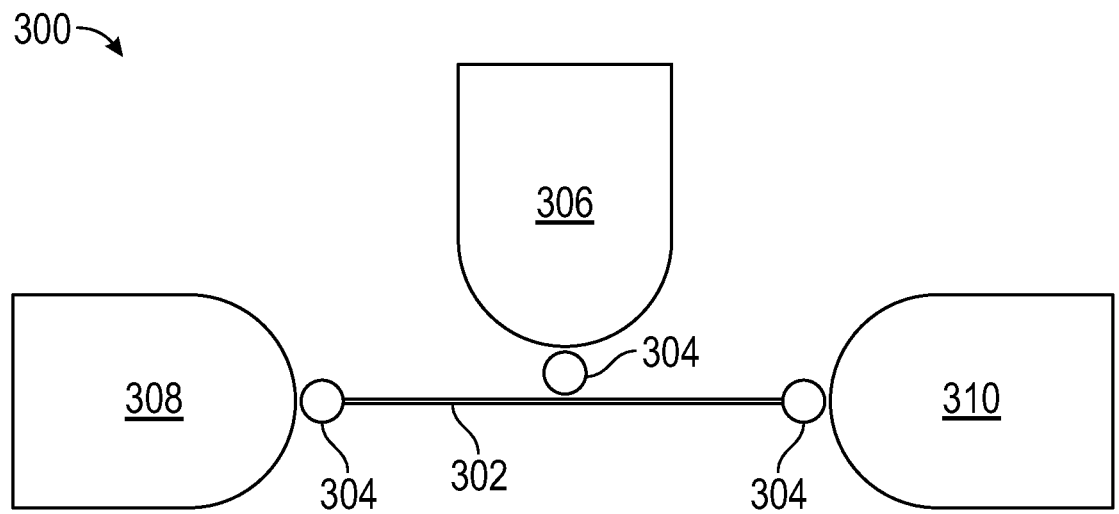
FIG. 3 shows a top view of a schematic layout of an exciton transistor employed as a fast optical switch.
Figure 4:
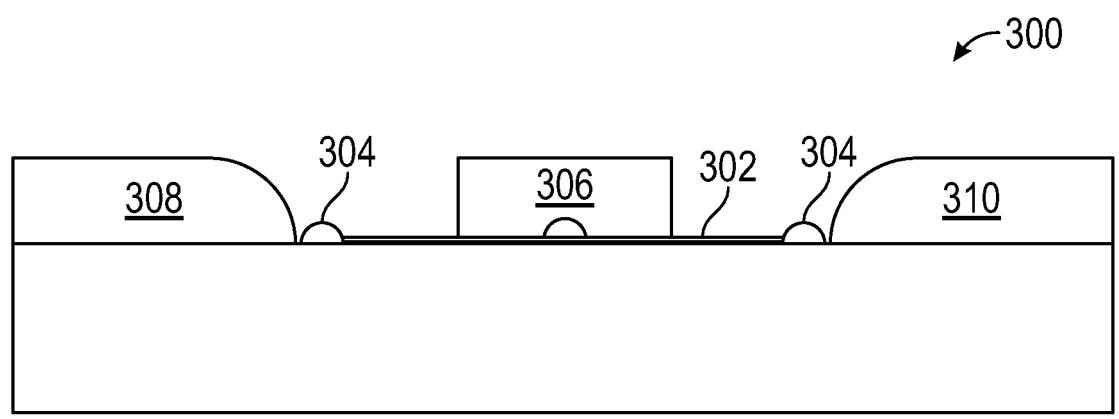
FIG. 4 shows a side view of the schematic layout of an exciton transistor employed as a fast optical switch of FIG. 3.

The exciton transistor 100 can form the heart of an optical switch 300 shown in FIGS. 3-4 that can be employed in integrated and fiber optic communications systems. Similarly, the exciton transistor 100 could also be configured as an optical modulator that can be employed in integrated and fiber optic communications systems. As an analogy can be made between the exciton transistor 300 and field-effect transistors, the terminology of transistors will be employed.

The exciton transistor 100 comprises an exciton channel 302, pads 304, a gate 306, a source 308, and a drain 310. The gate 306, source 308, and drain 310 all represent optical waveguides which extend beyond the region shown. The source waveguide 308 carries the signal that is to be switched. The source waveguide 308, in some embodiments, comprises a steady flow of light such as that coming from a CW laser. The drain waveguide 310 carries the fraction of this light that has made it through the device: that is, the light that has been modulated or switched on or off. The gate waveguide 306 carries the light signal that performs the switching.

The pads 304 in FIGS. 3-4 can be gold pads that serve two functions. The first function is to provide a pad 304 to which the exciton channel 302 can be attached to during assembly of the optical switch 300. The second function is to serve as a coupler that converts photons into excitons and vice versa.

Taking the source end of the exciton channel 302 as an example, the electric field of the incoming light field can be concentrated on the gold pad 304. On the gold pad 304 this concentrated electric field can be referred to as a plasmon field. The concentrated electric field induces electric field oscillations in a row of dye molecules 406 within the exciton channel 302. In terms of the quanta of these fields, the coupler can be said to make two transformations. The first transformation is to convert a photon into a plasmon; the second transformation is to convert a plasmon into an exciton. By concentrating the electric field, the conversion of incoming photos into excitons is more efficient than if the exciton channel 302 were connected directly to the source waveguide 308. The coupler is a reciprocal device, meaning that it converts excitons into photons as efficiently as it converts photons into excitons. Hence, excitons arriving at the drain waveguide 310 of the optical switch 300 are transformed by the coupler into photons that then propagate away along the drain waveguide 310.

The exciton channel 302 can be a DNA origami nanotube 400 (FIGS. 5-6) containing a row of dye molecules 406 along a length of the DNA origami nanotube 400. The purpose of the DNA origami nanotube 400 is to transport the energy of the photons arriving via the source waveguide 308 past the gate waveguide 306 and to the drain waveguide 310. This energy is transported in the form of excitons.

DNA origami is a DNA nanotechnology fabrication technique. One example of DNA origami is described in Rothemund, "Folding DNA to Create Nanoscale Shapes and Patterns," Nature 2006, 440, 297-302, which is herein incorporated by reference. Rothemund illustrates in FIGS. 1(c) and 1(e) of his publication a technique that employs a long single strand of DNA called a scaffold strand. The scaffold strand's base sequence can be regarded as pseudo-random. Such strands are often obtained from bacteriophages (viruses that infect bacteria). A convenient source for such DNA is the M13 bacteriophage since it packages its genome as single-stranded DNA. Viruses can be cultured, extracted, and their DNA purified. Conveniently, single-stranded M13 bacteriophage genomic DNA are now commercially available. Although the base sequence of the M13 bacteriophage codes for proteins and therefore has meaning biologically, from a technological point of view the base sequence statistics are close to that of a random sequence of bases (a random sequence of the four letters A, C, G, and T). Hence, it is a pseudorandom sequence. But because the M13 bacteriophage's genome has been sequenced, the DNA sequence has since become known.

Thereby, it is now possible to design short DNA strands, called staple strands, whose base sequences are complementary to certain regions of the scaffold strand by design. The base sequences for the staple strands are designed using the known DNA sequence of the scaffold strand and are produced by automated DNA synthesis machines. Such staple strands can be purchased commercially from foundries. One can, as an example, communicate the base sequences of the desired DNA strands to the foundry and the corresponding DNA strands are then produced by an automated DNA synthesis machine. These staple strands are designed to bind uniquely to specific regions on the scaffold strand. Examples of these are the short colored strands seen in FIGS. 1(c) and 1(e) of Rothemund.

Other options are also available for producing large origami structures, and for the case here DNA nanotubes 400 that can serve as substrates 312 for the dyes composing the exciton channel 302. Some methods for making DNA origami scaffolds, such as the use of bacteriophage-based ssDNA production, have resulted in producing scaffolds as large as 31,274 nucleotides (nt). ssDNA 31,274 nt long has a length of 11,000 nanometers or 11 microns. Folded 5 times yields scaffolds of length 2.2 microns. This is more than sufficient to span the distance between the source and drain waveguides 308, 310 of FIGS. 3-4.

By these means, the long scaffold strand can be folded into a geometrical shape. This assembly occurs in an aqueous solution consisting of a buffer containing salt. The scaffold strand and the staple strands are mixed together in the solution. The scaffold strand and the staple strands diffuse in the solution and encounter each other and complementary base sequences combine (the technical term is hybridize) to spontaneously form the geometric shape. To obtain the desired shapes in high yield, the solution is heated to above the melting temperature (the temperature at which duplex DNA dissociates into single strands) and then slowly cooled to room temperature. The melting temperature depends on the length of the complementary regions of DNA but for the short staple strands employed in DNA origami, heating to a temperature somewhere in the range of 60° C. to 90° C. is sufficient.

FIG. 2 of the Rothemund publication illustrates the capability of the DNA origami assembly technique. The first row indicates the layout of the scaffold strand to form the desired shape. The second row shows the predicted pattern when the staple strands are added. The third row shows atomic force microscope (AFM) images of the actual shapes produced. The fourth row illustrates some phenomena observed with AFM imaging, such as distortion of the origami in column a. The aggregation of origami by the "sticky" ends of the duplex DNA strands of the DNA origami, as shown in the Rothemund publication as columns b-e, and the well-behaved nature of the shape in column f due to the fact that this structure presents no sticky ends.

Although the structures Rothemund produced in his initial published work were planer 2-dimesional objects, this technique can be extended to produce 3-dimensional objects. Of interest here is the formation of DNA nanotubes suitable for purposes of fabricating the ballistic exciton transistor 100 and optical switch 300 described herein that can serve as substrates on which dye molecules 406 can be arranged. In other words, DNA origami can be used to assemble DNA nanotubes, including the DNA nanotubes 400 shown in FIGS. 5-6.

In some embodiments, in order to produce a DNA nanotube of sufficient length, the overall structure can comprise two DNA nanotubules 400 (formed form M13 bacteriophage scaffold strands) spliced together. The two DNA origami nanotubes, individually, can be approximately 400 nanometers in length, whereas the overall structure can be approximately 800 nanometers in length.

It is worth noting FIGS. 1(a) and 4(d) of Douglas et al., "DNA-nanotube-induced alignment of membrane proteins for NMR structure determination," PNAS 2007, 104, 6644-6648, which is herein incorporated by reference in its entirety, indicate the overall structure of the DNA-nanotube which can be thought of as six parallel duplex-DNA strands that are held together by stable strands that cross over from one duplex DNA strand to another. FIG. 1(c) of Douglas et al. shows a layout of the two scaffold DNA strands. FIGS. 1(e) and 1(f) of Douglas et al. show how the staple strands are laid relative to the scaffold strands. A repetitive motive is used as indicated by FIG. 1(b) of Douglas et al.

The number of parallel duplex strands making up the nanotube can be varied. In Douglas et al., a tube consisting of six such DNA strands was chosen, often referred to as a six-helix bundle. The size of the inter diameter of the tube can be varied by changing the number of duplex stands making up the bundle.

Figure 5:
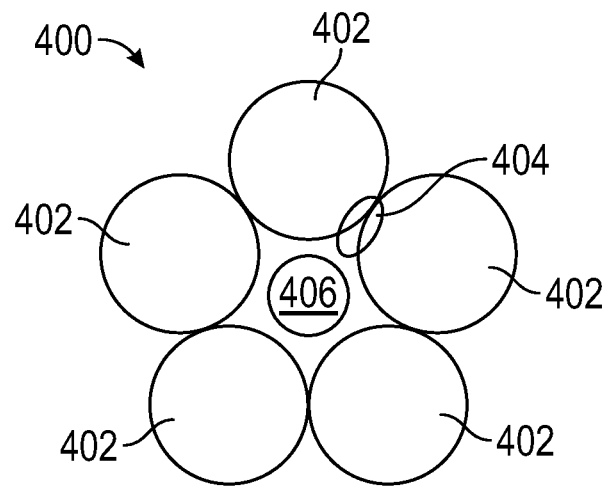
FIG. 5 shows a front view of an exemplary five-helix bundle DNA nanotube.
Figure 6:
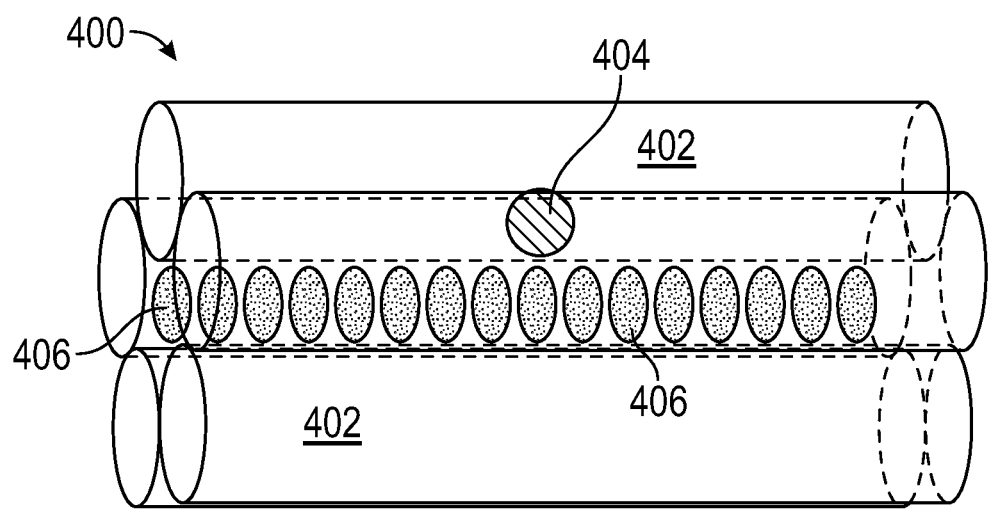
FIG. 6 shows a side view of the exemplary five-helix bundle DNA nanotube of FIG. 5.

With reference to FIGS. 5-6 of the present disclosure, a five-helix bundle DNA nanotube 400 is most preferred for construction of the exciton channel 302. However, it is envisioned that other numbers of helix bundles may provide similar and/or distinct benefits, and selection of an optimal number of helix bundles will depend upon the application in which the nanotube is being utilized. The diameter of a duplex strand of DNA 402 can be approximately two (2.0) nanometers. The inner diameter of this nanotube 400 can be approximately one and four tenths (1.4) nanometers, a size that is comparable to the size of a typical organic dye molecule 406.

Dyes 406 can be attached at specific points along the DNA 402. Keeping in mind that duplex DNA 402 is often a helical structure (e.g., the double helix), staple strands can be designed such that when the DNA nanotube 400 self-assembles, the attachment of the dye molecules 406 is at points on the inside of the DNA nanotube 400. The dye molecules 406 will thus be on the inside of the nanotube 400, as shown in FIGS. 5-6. The spacing between bases in DNA is 0.34 nm and roughly 10 bases form one complete turn of the double helix. With a five-helix bundle nanotube 400 the stable strands can be designed such that the dyes will be stacked with a spacing of 0.34 nm. Close spacing between dyes 406 is desirable in that it increases the exciton exchange energy between dyes 406 which, in turn, causes the exciton to propagate more quickly and with less energy loss through the exciton channel 302.

Software can be used to aid the design of DNA origami structures such as the nanotube 400 considered herein. One example of such software is CanDo (Computer-aided engineering for DNA origami). The design of origami structures is thus a task that can be largely automated. Examples of dyes, available commercially, that can be attached to DNA and that can serve as the dyes that constitute the exciton channel are the Cyanine dyes Cy5 and Cy5.5, but many more dye types are available and those skilled in organic chemistry can synthesis their own custom dyes that can be incorporated into DNA via covalent bonds during the synthesis of the DNA 402.

The molecules $b_r$ can also comprise other dyes, and more particularly, the chromophores of said dyes. For example, chromophores that can be used include one or more of a xanthene, fluorescein, rhodamine, oregon green, eosin, Texas red, cyanine, indocarbocyanine, oxacarbocyanine, thiacarbocyanine, merocyanine, squaraine, Seta, SeTau, Square dyes, naphthalene, dansyl, prodan, coumarin, oxadiazole, pyridyloxazole, nitrobenzoxadiazole, benzoxadiazole, anthracene, anthraquinone, DRAQ5, DRAQ7, CyTRAK Orange, pyrene, cascade blue, oxazine, Nile red, Nile blue, cresyl violet, oxazine 170, acridine, proflavin, acridine orange, acridine yellow, arylmethine, auramine, crystal violet, malachite green, tetrapyrrole, porphin, phthalocyanine, and bilirubin, and/or a combination thereof.

Methods to attach DNA 402 to gold surfaces 304 include methods by which the exciton channel 302 is connected between at least two gold pads 304. Topography can also be used to control nanotube 400 alignment.

Dipole Moments

The difference static dipole-dipole interaction, resulting from differences in the charge density of a molecule when it is in its excited state compared to when it is in its ground state, is employed. Dye 404 and the most proximal dye 406 to the gate region 306 must have difference static dipole moments.

In order to function as an exciton channel 302 that can be gated, the dye molecules 404 and 406, the latter the channel dye that is proximal to the gate region 306 must have a difference static dipole moment that is large, preferably comparable to the transition dipoles involved in exciton exchange 104. Organic dyes can have transition dipoles as high as 16 D, where D denotes the unit "debye" which is used to measure the strength of electric dipole moments. Asymmetry in the conjugated π-bond network of an organic dye molecule facilitates the position of a large difference static dipole moment that is large and hence yields exciton-exciton interactions 104 between dyes. Examples of dyes having an asymmetric conjugated π-bond network and that are commercially available for attachment to DNA are family of dyes offered by Dyomics, such as the dyes DY-550 through DY-831. This range of dyes allows the selection of dyes having optical transition frequencies close to frequencies of the light signals 110 that are to be switched. A number of organic molecules that have been theoretically calculated to have difference static dipole moments as large as 16 D are descried in Jacquemin, "Excited-state dipole and quadrupole moments: TD-DFT versus CC2," J. Chem. Theory Comput. 2016, 12, 3993-4003, herein incorporated by reference in its entirety.

See, e.g., molecular structure 17 in Jacquemin's scheme 2 and the corresponding entries in their Table 3 where different calculational methods consistently predict large difference static dipole moments, around 16 D. The difference static dipole moments can also be referred to as "excess dipole moments."

Beneficially, the present disclosure notes functional groups can be added to these compounds in such a way that they can be covalently attached to DNA during DNA synthesis without significantly altering the optical properties of the molecules.

The gate region 306 also contains a special dye molecule 404 (or several such dye molecules) depicted as the ellipsoid of FIGS. 5-6, in contrast to the dyes 406 of the exciton channel 302, which are depicted in the row of ellipsoids. It is the special dye 404 and proximal 406 dye that give rise to the exciton-exciton interaction 108 responsible for switching, that is, excitons residing on these dyes block the flow of excitons in the exciton channel 302. In order for this gate to function properly the exciton residing on the gate dye 404 must be prevented from hoping to the exciton channel 302 via the exchange interaction 108. This can be accomplished by orienting the dye 404 such that its transition dipole is orthogonal to that of the transition dipoles in the exciton channel 302. This is illustrated in FIGS. 5-6 by depicting the ellipsoid axis of the two types of dyes to be orthogonal, that is, the ellipsoids of the exciton channel dyes are oriented with their short axis parallel to the exciton channel, whereas the gate dye is oriented with its short axis perpendicular to the exciton channel axis. The gate dye 404 is shown maintaining its orientation by being sandwiched between two of the DNA duplex strands 402. The position at which this dye must be attached to a DNA stable strand 402 to maintain this configuration can be determined during the DNA origami design process. An additional requirement is that the exciton-exciton interactions 104 not go to zero when the exciton exchange interaction 108 between the gate dye 404 and the channel dyes 406 is zero. This requires that the difference static dipole moment not be parallel to the transition dipole for at least one of either the proximal channel dye 406 or the gate dye 404.

For typical dye molecules 406 the conjugated π-bond network is approximately linear and as a consequence the difference static dipole moment and the transition dipole tend to both be collinear with the long axis of the conjugated π-bond network. There are, however molecules for which the difference static dipoles and transition dipoles are not parallel. An example for which the two dipoles are perpendicular to each other is given by molecule 28 in scheme 2 of Jacquemin. This molecule is shown as follows:

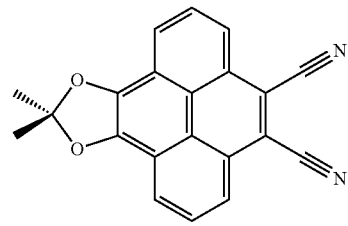

For this molecule, the difference static dipole moment lies parallel to the horizontal axis while the transition dipole lies parallel to the vertical axis. Applicant has verified the strength of the difference static dipole moment for this molecule is approximately 8 D. Although Jacquemin did not report the value of the transition dipole moment, Applicant has calculated via time-dependent density functional theory (TD-DFT) that the molecule has a transition dipole moment of 4 D. When used as a gate molecule 404, a small transition dipole moment is not serious because the molecule 404 is not being used as part of the exciton channel 302. A difference static dipole moment of 8 D would be adequate for switching. Because the difference static dipole moment for this gate molecule 404 is perpendicular to its transition dipole moment, the gate molecule 404 can be oriented such that its transition dipole is orthogonal to the transition dipole moments of the exciton channel dipoles while its difference static dipole moment is close to parallel with that of the channel dyes, thereby giving rise to a large exciton-exciton interaction 108.

Other Non-Limiting Examples of Excitonic Devices that can Employ the Excitonic Ballistic Transistor It is to be appreciated that exciton wires may be formed when a series of chromophores are held within the architecture so that when a first chromophore, the "input chromophore," is excited and emits an exciton, the exciton passes, without loss of energy if sufficiently close, to a second chromophore. That chromophore may then pass the exciton to a third chromophore, and so on down a line of chromophores in a wavelike manner. The wires may be straight or branched and may be shaped to go in any direction within the architecture. The architecture may contain one or more wires. Depending on the architecture system used, the exciton wires may be formed along a single nucleotide brick, such as in using the scaffold strand of nucleotide origami, or multiple bricks may comprise the wire, such as in molecular canvases. When two or more wires are brought sufficiently close to each other such that they are nanospaced, the exciton may transfer from one wire to the other. By controlling this transfer, it is possible to build quantum circuits and gates. Some examples of said quantum circuits and gates are described in co-owned, co-pending U.S. patent application Ser. No. 17/447,839, titled ENTANGLEMENT OF EXCITONS BY ACOUSTIC GUIDING, filed Sep. 16, 2021. The originally filed contents of U.S. patent application Ser. No. 17/447,839 are hereby incorporated by reference in their entirety including without limitation, the specification, claims, and abstract, as well as any figures, tables, appendices, or drawings thereof. Quantum algorithms enable the speed-up of computation tasks such as, but not limited to, factoring and sorting. These computations may be performed by an excitonic quantum computer. The excitonic quantum computer can be made from exciton coherence wires, circuits, and gates, such as those described in co-pending, co-owned U.S. Pre-Grant Pub. No. 2019/0048036, which is herein incorporated by reference in its entirety.

Exciton wires can be made by closely spacing chromophores $b_r$ together as depicted in FIG. 1 row 102. As discussed above, when chromophores are nanospaced apart, an exciton may transfer from one chromophore to another without the loss of energy. An exciton created at one end of the row of chromophores 102 may propagate down the row, hopping from one chromophore nanospaced to the next. This is done in a wavelike manner.

Exciton circuits made from these exciton wires may be made to be analogous to electronic circuits but where excitons carry the signals rather than electrons in classical computing. By bringing two exciton wires sufficiently close to each other an exciton can hop from one wire to the other by transferring from one chromophore to another. By doing this carefully one can make devices that function as signal dividers such as those found in Yurke et al., "Passive Linear Nanoscale Optical and Molecular Electronics Device Synthesis from Nanoparticles, 2000, Phys. Rev. A, 81, 033814, which is herein incorporated by reference in its entirety. The division ratio depends on rates with which excitons can be transferred between chromophores in the coupling region. The transfer rate depends on the spacing between the chromophores and their orientations. This dependence on spacing and orientation enables the construction of signal dividers with, for practical purposes, any division ratio. An exciton propagating down one exciton wire will become delocalized so that one must think of the exciton as being in a superposition state where it resides on both exciton wires. This excitonic device is a basis-change gate. The function of which is analogous to that of an optical beam splitter or microwave directional coupler. A basis-change gate is one of the fundamental quantum gates.

Another quantum gate of fundamental importance is a phase-shift gate. The phase accumulated by an exciton is proportional to the distance it travels. Hence, a phase-shift gate can simply be made by engineering the wire that the exciton travels over to have the length needed to accumulate the proper amount of phase. The phase an exciton accumulates is also determined by its energy relative to the optical transition energy for the chromophore. The optical transition energy here denotes the energy difference between the chromophore's ground electronic state and its lowest excited electronic state that has an allowed optical transition. Hence, phase shifters can also be fashioned choosing the chromophores of differing optical transition energies. It is also possible to make phase shifters by terminating two ports of a signal divider with chromophores having differing optical transition energies.

Another quantum gate of fundamental importance is a controlled basis change gate. In contrast to the gates already discussed, which rely on wave interference effects, a controlled basis change gate relies on the interaction between two excitons. When two excitons reside on neighboring chromophores they feel each other's presence just like two electrons will feel each other's Coulomb repulsion when they are brought close together. The two-exciton interaction arises from static Coulomb interactions between molecules and is most strong when the molecules have an asymmetric molecular structure. Asymmetric molecules possess a permanent electric dipole which changes sign when the molecule is excited from the ground state to the excited state. The static Coulomb interaction, in this case is a dipole-dipole interaction which, when both chromophores are excited (the two-exciton case), differs in sign from the case when only one chromophore is excited (the one-exciton case). Due to the static Coulomb interactions between chromophores one exciton will accumulate extra phase in the presence of the other exciton. As a result, the presence or absence of one exciton can control how the other exciton moves through a basis change gate.

These three types of gates, the basis-change gate, the phase-shift gate, and the controlled basis-change gate, form a complete set if the phase-shift gates can be produced with a finite set of phase angles. Because the phase angles can be controlled by the exciton path length, the optical transition energies of the phase-shifter wire chromophores, or through the construction of optical phase-shifter gates out of basis-change gates with selected ports terminated, this last requirement can be met. With this finite set of gates, one can assemble exciton circuits that perform any quantum computation. A set of gates having this property is said to be capable of universal quantum computation. This is analogous to the electronic computer case where the NAND gate is a universal gate in that any Boolean function can be implemented by a circuit employing only NAND gates.

It is possible to perform universal quantum computation with just basis-change gates and phase-shift gates, but the number of parts (gates) one needs grows exponentially with the size of the problem. So, doing quantum computation this way performs as well as classical computers. By introducing controlled basis-change gates one can drastically reduce the parts count so that much fewer parts are required than for a classical computer. The controlled basis-change gate enables the entanglement of many-body (many-exciton) states so that a network of quantum gates acts as if it is performing many different computations simultaneously. This is similar to an n bit memory register. In a classical computer each memory element of the register can be in either a "zero" or a "one" state but not both simultaneously. In contrast a quantum mechanical register can be in a state that is a quantum mechanical superposition of being in the zero state and the one state. An n bit quantum memory in this sense can act as if it is holding 2n bits of information, whereas the classical computer memory only holds n bits of information. A single controlled basis-change gate accepting as inputs the contents of memory elements i and j and delivering the outputs back to memory elements i and j can update the amplitudes of all of the 2n states in the superposition of the memory register simultaneously. This is quantum parallelism.

Not all math problems are known to benefit from quantum speedup, but several classes of problems are known where quantum computers can vastly outperform classical computers. Two of the problems are factoring and database searching.

Chromophores, however, exhibit many non-ideal characteristics for quantum computing. The electronic degrees of freedom are strongly coupled to the vibrational and environmental degrees of freedom. This causes phase jitter, which causes phase error to grow with time, thus spoiling the interference effects that the quantum gates relay on. All quantum computers suffer from this problem to a greater or lesser extent. Chromophores are also difficult to arrange in the requisite configurations.

What exciton quantum computers have in their favor is fast switching time, compact size (the components are relatively small molecules), and possible room temperature operation. Because photons are readily converted into excitons and excitons are readily converted into photons, it is noted that the above excitonic devices may find application in optical information processing, apart from quantum computing, as more compact embodiments of the currently employed optical phase shifters, signal dividers, and switches that can employ Kerr nonlinearities, which have the functionality of controlled basis-change gates. For these applications the performance requirements are less demanding than that for quantum computation.

Finally, it is to be appreciated Applicants have created compositions of non-reciprocal optical devices comprising of aggregates of chromophores either attached to a nucleotide architecture or covalently bonded having a desired conformation, such as those described in co-owned, co-pending U.S. patent application Ser. No. 17/443,285, titled MOLECULAR AGGREGATE FOR OPTICALLY-PUMPED NONRECIPROCAL EXCITON DEVICES, filed Jul. 23, 2021. The originally filed contents of U.S. patent application Ser. No. 17/443,285 are hereby incorporated by reference in their entirety, including without limitation, the specification, claims, and abstract, as well as any figures, tables, appendices, or drawings thereof.

From the foregoing, it can be seen that the present invention accomplishes at least all of the stated objectives.

LIST OF REFERENCE CHARACTERS

The following table of reference characters and descriptors are not exhaustive, nor limiting, and include reasonable equivalents. If possible, elements identified by a reference character below and/or those elements which are near ubiquitous within the art can replace or supplement any element identified by another reference character.

TABLE 1

| | List of Reference Characters |
|---|---|
| a | gate molecule |
| b | molecule |
| r (e.g. −2, −1, 1, 2) | position of molecules along the transmission line |
| J | strength parameter of exciton exchange interaction |
| K | strength parameter of two-body exciton interaction |
| 100 | ballistic exciton transistor |
| 102 | exciton transmission line |
| 104 | exciton exchange interaction (e.g., a linear exciton exchange interaction) |
| 106 | gate |
| 108 | two-body exciton interaction |
| 110 | incoming signals |
| 112 | reflected signals |
| 114 | transmitted signals |
| 200 | plot |
| 300 | optical switch |
| 302 | exciton channel |
| 304 | coupler (e.g., gold pads) |
| 306 | gate waveguide/region |
| 308 | source waveguide/region |
| 310 | drain waveguide/region |
| 312 | substrate |
| 400 | nanotube |
| 402 | duplex strand of DNA |
| 404 | special dye molecule (e.g., a type of gate molecule a) |
| 406 | dye molecules (e.g., a row of molecules b) |

Glossary

Unless defined otherwise, all technical and scientific terms used above have the same meaning as commonly understood by one of ordinary skill in the art to which embodiments of the present invention pertain.

The terms "a," "an," and "the" include both singular and plural referents.

The term "or" is synonymous with "and/or" and means any one member or combination of members of a particular list.

The terms "invention" or "present invention" are not intended to refer to any single embodiment of the particular invention but encompass all possible embodiments as described in the specification and the claims.

The term "about" as used herein refer to slight variations in numerical quantities with respect to any quantifiable variable. Inadvertent error can occur, for example, through use of typical measuring techniques or equipment or from differences in the manufacture, source, or purity of components.

The term "substantially" refers to a great or significant extent. "Substantially" can thus refer to a plurality, majority, and/or a supermajority of said quantifiable variable, given proper context.

The term "generally" encompasses both "about" and "substantially."

The term "configured" describes structure capable of performing a task or adopting a particular configuration. The term "configured" can be used interchangeably with other similar phrases, such as constructed, arranged, adapted, manufactured, and the like.

Terms characterizing sequential order, a position, and/or an orientation are not limiting and are only referenced according to the views presented.

In mesoscopic physics, "ballistic conduction" (ballistic transport) is an unimpeded flow (or transport) of charge carriers (usually electrons), or energy-carrying particles, over relatively long distances in a material. In general, the resistivity of a material exists because an electron, while moving inside a medium, is scattered by impurities, defects, thermal fluctuations of ions in a crystalline solid, or, generally, by any freely-moving atom/molecule composing a gas or liquid. Without scattering, electrons obey Newton's second law of motion at non-relativistic speeds. Here, the definition is extended to excitons that propagate without energy loss.

A "chromophore" is the part of a molecule responsible for its color. The chromophore is a region in the molecule where the energy difference between two separate molecular orbitals falls within the range of the visible spectrum. Visible light that hits the chromophore can thus be absorbed by exciting an electron from its ground state into an excited state. In biological molecules that serve to capture or detect light energy, the chromophore is the moiety that causes a conformational change of the molecule when hit by light.

A "J-aggregate" is a type of dye with an absorption band that shifts to a longer wavelength (bathochromic shift) of increasing sharpness (higher absorption coefficient). In "H-aggregates", a hypsochromic shift is observed with low or no fluorescence. Bathrochromically shifted "J-bands" and hypsochromically shifted "H-bands" have been explained in terms of molecular exciton coupling theory, i.e., coupling of transition moments of the constituent dye molecules. J and H aggregates can aggregate under the influence of a solvent or additive or concentration as a result of supramolecular self-organization. J and H aggregates can alternatively be formed by templating dyes to a scaffold such as DNA to control their proximity and orientation. Thus, it is to be appreciated the present disclosure is not to be limited to solely the aggregation phenomena to a self-organizing process.

A "bathochromic shift" is often referred to as a "red shift" in photochemistry. Bathochromic shifts are a change of spectral band position in the absorption, reflectance, transmittance, or emission spectrum of a molecule to a longer wavelength (lower frequency). Hypsochromic shifts are often referred to as "blue shifts" in photochemistry. Blue shift is the phenomenon in which the frequency of an electromagnetic wave, such as light, emitted by a source moving towards the observer is shifted towards the blue side of the electromagnetic spectrum (wavelength is decreased or energy is increased).

The "scope" of the present invention is defined by the appended claims, along with the full scope of equivalents to which such claims are entitled. The scope of the invention is further qualified as including any possible modification to any of the aspects and/or embodiments disclosed herein which would result in other embodiments, combinations, subcombinations, or the like that would be obvious to those skilled in the art.

What is claimed is:

1. An excitonic device comprising:
    an exciton transmission line composed of a row of chromophores through which signals can propagate, each chromophore of the row of chromophores being excitable from a ground state to a lowest electronic excited state;
    a gate molecule having a transition dipole moment oriented orthogonally to dipoles along the exciton transmission line;
    the gate molecule and the chromophore in the transmission line most proximal to the gate molecule, at a minimum, are asymmetric and possess a difference static dipole;
    an excitonic interchange comprising:
        a first location at which a linear exciton exchange interaction can occur, said linear exciton exchange interaction mediated by a transition dipole along the exciton transmission line; and
        a second location at which a two-body exciton interaction can occur, said two-body exciton mediated by a difference static dipole along the transmission line.

2. The excitonic device of claim 1 wherein the gate molecule comprises a dye.

3. The excitonic device of claim 2 wherein the linear exciton exchange has a strength characterized by an excitonic hopping parameter, said excitonic hopping parameter being dependent on a dye orientation and proximity relative to the chromophores in the exciton transmission line.

4. The excitonic device of claim 1 wherein the two-body exciton interaction has a strength characterized by, at least in part, an excitonic state parameter, an exciton-exciton interaction energy, that accounts for whether the gate molecule is in a ground state or an excited state.

5. The excitonic device of claim 1 wherein the device is configured as an optical switch or an on/off gate wherein:
    (i) when the gate molecule is not excited, transmission of said signals along the exciton transmission line occurs unimpeded; and
    (ii) when the gate molecule is excited, said signals are backscattered as a result of the two-body exciton interaction.

6. The excitonic device of claim 1 wherein a direction of the transition dipoles and the difference static dipole are not parallel in at least the gate molecule or the chromophore in the transmission line most proximal to the gate molecule.

7. The excitonic device of claim 1 wherein transfer of excitons from the gate molecule to the exciton transmission line is prevented.

8. The excitonic device of claim 1 wherein the gate molecule can be excited optically without exciting the row of chromophores if polarized light with a polarization parallel to the transition dipole moment is used.

9. The excitonic device of claim 1 wherein the gate molecule can be excited optically without exciting the row of chromophores if the optical excitation energies of the gate molecule and the row of chromophores are chosen so that (i) an absorption band of the gate molecule does not overlap with that of the row of chromophores and (ii) a wavelength of light, regardless of polarization, lies only within the absorption band.

10. The excitonic device of claim 1 wherein the components of the excitonic device are symmetrically arranged about an axis defined by the gate molecule and a chromophore within the row of chromophores proximal to the gate molecule.

11. A ballistic exciton transistor relying on an exciton exchange interaction and a two-body exciton interaction, said ballistic exciton transistor comprising:
    an exciton exchange interaction mediated by transition dipoles;
    a two-body exciton interaction is mediated by the difference static dipoles;
    a first chromophore and a second chromophore oriented such that the first chromophore and the second chromophore can interact only via the two-body exciton interaction;
    an exciton transmission line comprising at least the second chromophore, a third chromophore, and a fourth chromophore;
    wherein transition dipoles of the first chromophore and the second chromophore are arranged such that the transition dipoles do not couple.

12. The ballistic exciton transistor of claim 11 wherein the first chromophore and the second chromophore comprise asymmetric organic dye molecules.

13. The ballistic exciton transistor of claim 11 wherein the first chromophore has a transition dipole moment oriented orthogonally to dipoles along the exciton transmission line.

14. The ballistic exciton transistor of claim 11 wherein the two-body exciton interaction is mediated by a Coulombic quadrupole-quadruple interaction.

15. The ballistic exciton transistor of claim 11 wherein:
the third chromophore is located at an upstream location relative to the second chromophore with respect to how signals propagate along the exciton transmission line; and
the fourth chromophore is located at a downstream location relative to the second chromophore with respect to how signals propagate along the exciton transmission line.

16. The ballistic exciton transistor of claim 11 wherein when the first chromophore is excited by absorption of a photon, an exciton is trapped on the first chromophore and additional excitons are backscattered along the exciton transmission line, thereby providing a signal gain.

* * * * *